United States Patent
Kaneko et al.

(10) Patent No.: US 10,276,478 B2
(45) Date of Patent: Apr. 30, 2019

(54) LEAD FRAME

(71) Applicant: SHINKO ELECTRIC INDUSTRIES CO., LTD., Nagano-shi, Nagano (JP)

(72) Inventors: Kentaro Kaneko, Nagano (JP); Yoshio Furuhata, Nagano (JP); Mitsuharu Sato, Nagano (JP); Toshio Masuda, Nagano (JP)

(73) Assignee: SHINKO ELECTRIC INDUSTRIES CO., LTD., Nagano-Shi (JP)

( * ) Notice: Subject to any disclaimer, the term of this patent is extended or adjusted under 35 U.S.C. 154(b) by 0 days.

(21) Appl. No.: 15/890,675

(22) Filed: Feb. 7, 2018

(65) Prior Publication Data

US 2018/0240739 A1    Aug. 23, 2018

(30) Foreign Application Priority Data

Feb. 17, 2017   (JP) ................................. 2017-028222

(51) Int. Cl.
*H01L 23/495*   (2006.01)
*H01L 21/48*    (2006.01)
(Continued)

(52) U.S. Cl.
CPC .... *H01L 23/49541* (2013.01); *H01L 21/4828* (2013.01); *H01L 23/13* (2013.01); *H01L 23/49548* (2013.01); *H01L 24/97* (2013.01); *H01L 21/67363* (2013.01); *H01L 23/14* (2013.01); *H01L 23/3114* (2013.01); *H01L 23/49582* (2013.01); *H01L 24/32* (2013.01); *H01L 24/45* (2013.01); *H01L 24/48* (2013.01); *H01L 24/73* (2013.01); *H01L 2224/32245* (2013.01); *H01L 2224/45144* (2013.01); *H01L 2224/45147* (2013.01); *H01L 2224/48091* (2013.01); *H01L 2224/48106* (2013.01);
(Continued)

(58) Field of Classification Search
CPC ........... H05K 1/03; H01L 21/48; H01L 21/56; H01L 21/60; H01L 23/00; H01L 23/48; H01L 23/495; H01L 33/38; H01L 33/50; H01L 33/54; H01L 33/56; H01L 33/60; H01L 33/62
USPC ...... 174/255; 257/88, 98, 99, 666, 669, 676, 257/737
See application file for complete search history.

(56) References Cited

U.S. PATENT DOCUMENTS

| | | | | |
|---|---|---|---|---|
| 4,400,714 A | * | 8/1983 | Brown | .............. H01L 23/49544 257/669 |
| 2011/0186868 A1 | * | 8/2011 | Watari | .................... H01L 24/49 257/88 |

(Continued)

FOREIGN PATENT DOCUMENTS

| JP | 2004-319816 | 11/2004 |
|---|---|---|
| JP | 2013-058693 | 3/2013 |

*Primary Examiner* — Xiaoliang Chen
(74) *Attorney, Agent, or Firm* — Rankin, Hill & Clark LLP

(57) ABSTRACT

A lead frame includes an outer frame. The outer frame includes: an upper surface; a lower surface that is opposite to the upper surface; a side surface between the upper surface and the lower surface; a first recess that is formed to extend from the upper surface to the side surface; a second recess that is formed to extend from the lower surface to the side surface; and a curved surface that is positioned between the side surface and a side wall of the first recess or between the side surface and a side wall of the second recess.

6 Claims, 16 Drawing Sheets

(PARTIAL ENLARGED PERSPECTIVE VIEW)

(51) Int. Cl.
  *H01L 23/13* (2006.01)
  *H01L 23/00* (2006.01)
  *H01L 21/673* (2006.01)
  *H01L 23/31* (2006.01)
  *H01L 23/14* (2006.01)

(52) U.S. Cl.
  CPC ............... *H01L 2224/48247* (2013.01); *H01L 2224/73265* (2013.01); *H01L 2924/00014* (2013.01); *H01L 2924/181* (2013.01); *H01L 2924/18165* (2013.01)

(56) References Cited

U.S. PATENT DOCUMENTS

| | | | |
|---|---|---|---|
| 2011/0272793 A1* | 11/2011 | Shimizu | H01L 21/4832 257/666 |
| 2012/0126378 A1* | 5/2012 | San Antonio | H01L 21/561 257/659 |
| 2012/0139104 A1* | 6/2012 | Camacho | H01L 21/4832 257/737 |
| 2013/0187188 A1* | 7/2013 | Sasaoka | H05K 1/0313 257/99 |
| 2013/0241041 A1* | 9/2013 | Yu | H01L 24/97 257/676 |
| 2016/0118558 A1* | 4/2016 | Abe | H01L 33/60 257/98 |
| 2016/0322548 A1* | 11/2016 | Abe | H01L 33/60 |
| 2017/0162520 A1* | 6/2017 | Kaneko | H01L 23/49548 |
| 2017/0271565 A1* | 9/2017 | Abe | H01L 33/60 |

\* cited by examiner

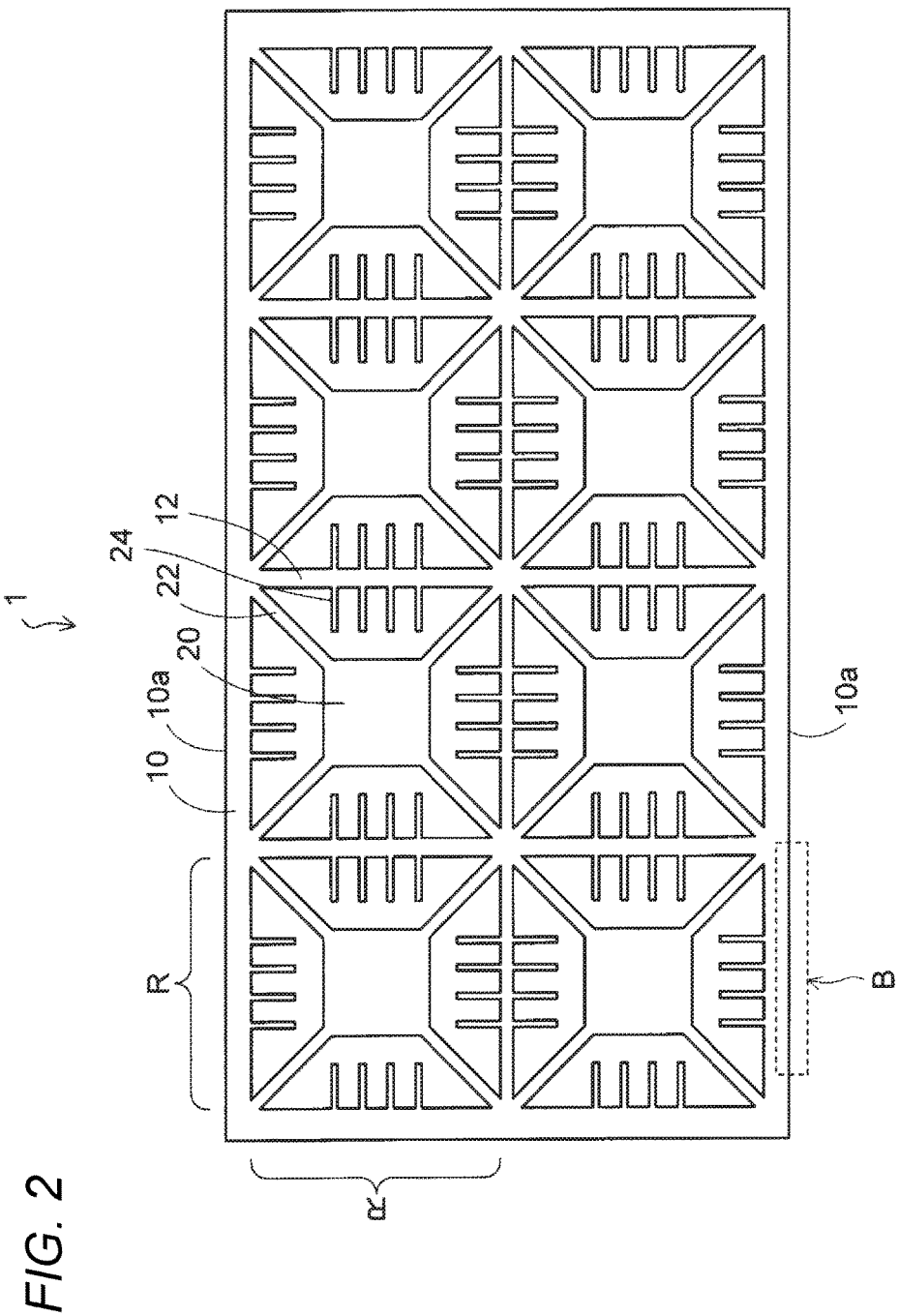

(PARTIAL ENLARGED PERSPECTIVE VIEW)

W2 > L1

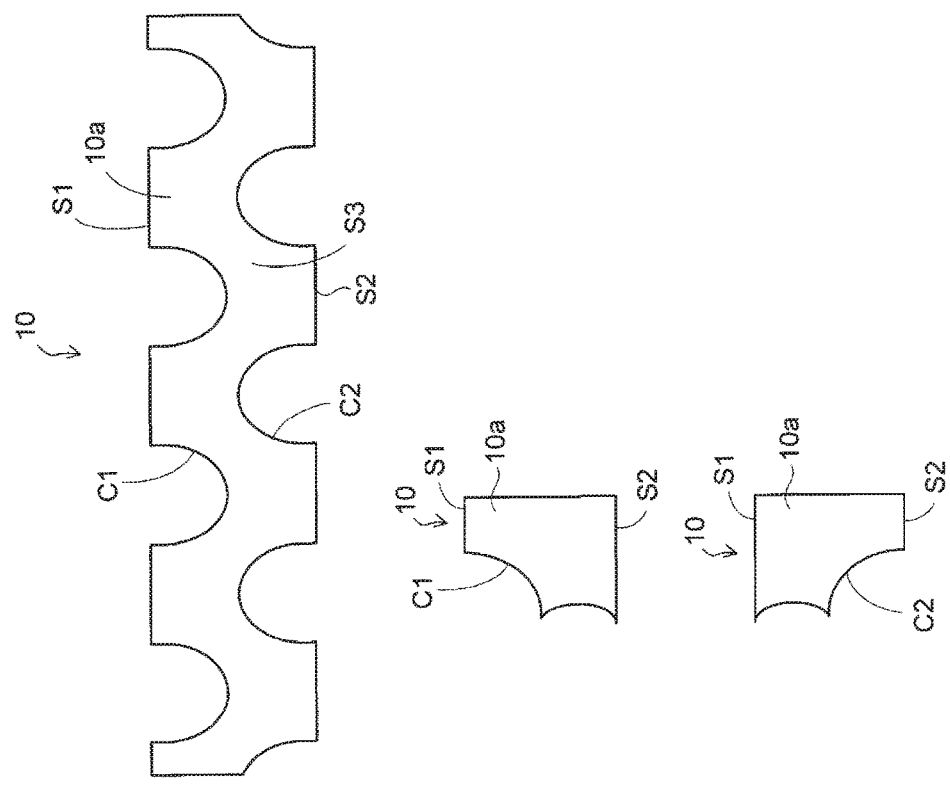

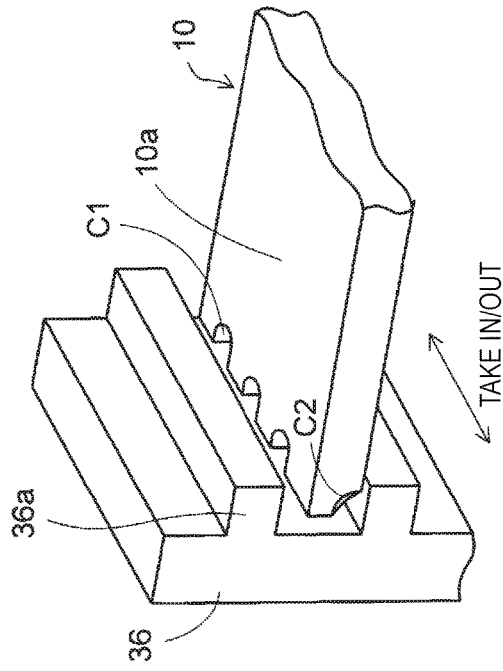
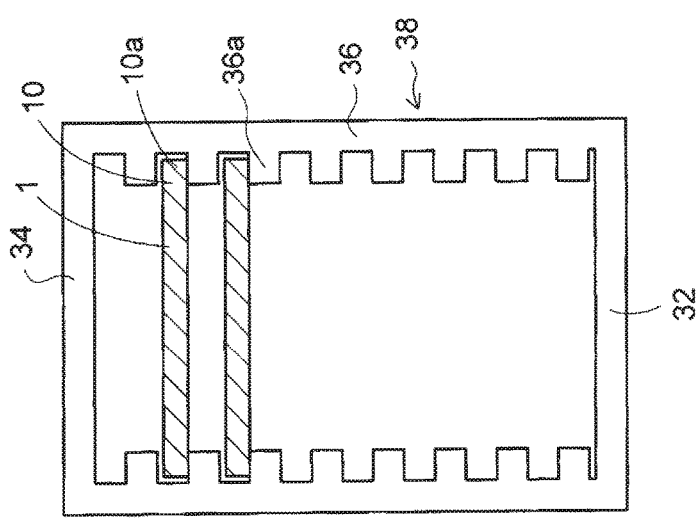

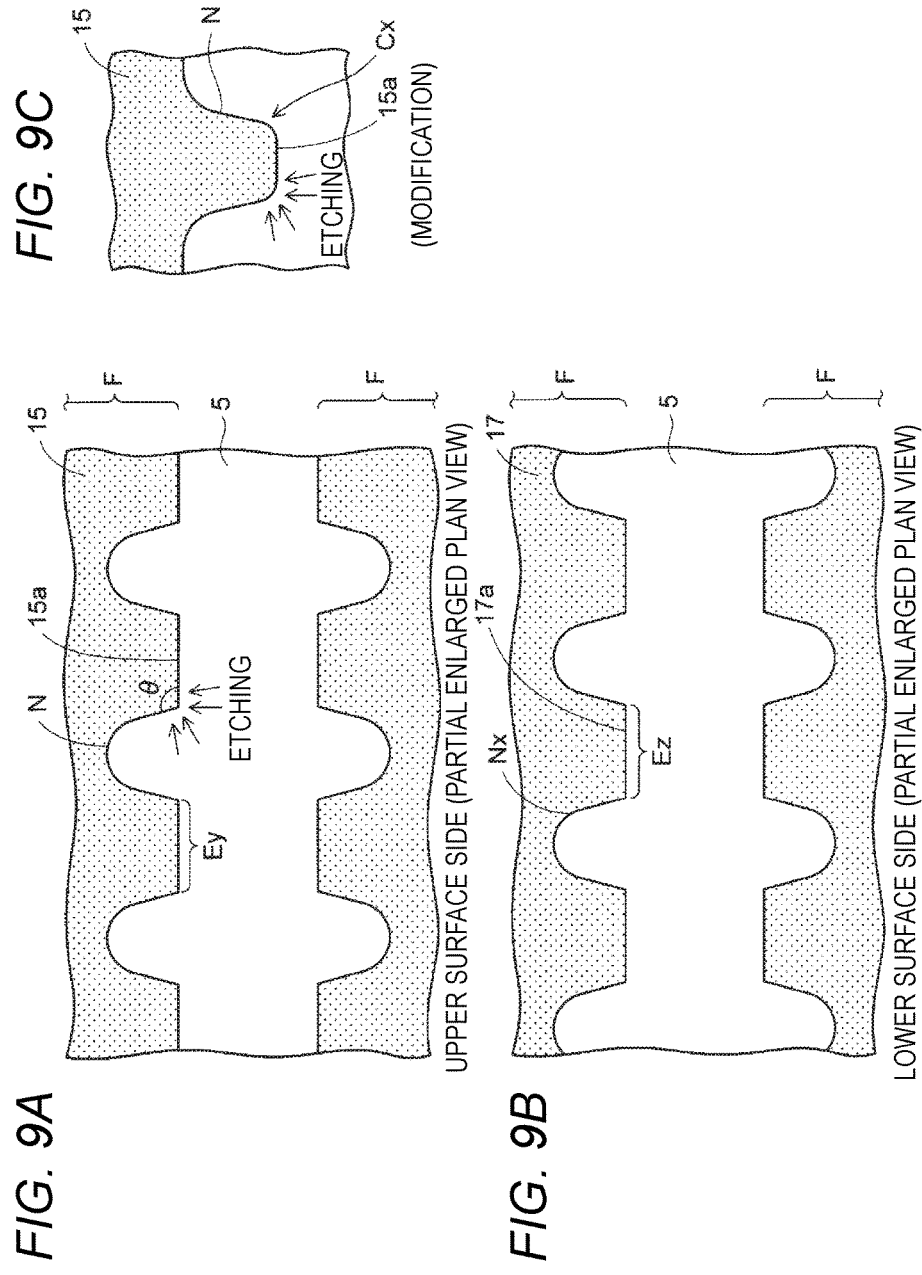

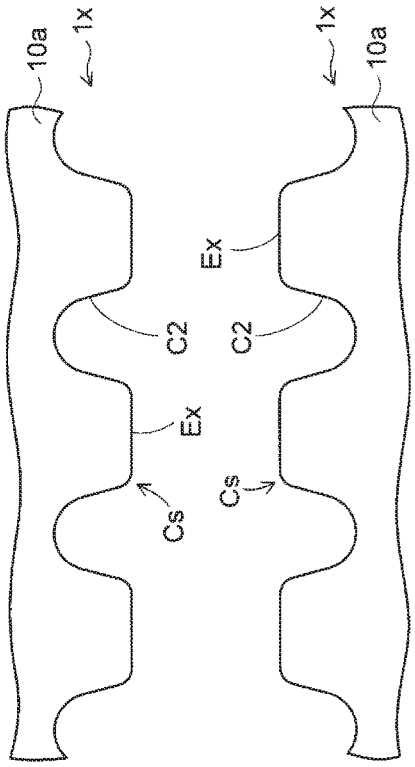
FIG. 11A
FIG. 11B

LEAD FRAME

This application claims priority from Japanese Patent Application No. 2017-028222, filed on Feb. 17, 2017, the entire contents of which are herein incorporated by reference.

BACKGROUND

1. Technical Field

The present disclosure relates to a lead frame.

2. Background Art

In the background art, there are lead frames for mounting electronic components such as semiconductor chips thereon. In such a lead frame, a semiconductor chip which has been mounted on a die pad is connected to ambient leads by wires, and the semiconductor chip and the wires are sealed with a sealing resin (e.g. see JP-A-2004-319816 and JP-A-2013-58693).

As will be described in an undermentioned preliminary matter, when the lead frame provided with an outer frame shaped to have long sides is stored in a frame stocker, there is a problem that right-angled portions of long side surfaces of the outer frame may contact and rub inner walls of the frame stocker to thereby cause occurrence of burrs.

SUMMARY

An object of the present disclosure is to provide a lead frame having a novel structure which can prevent burrs from occurring at side surfaces of an outer frame of the lead frame.

According to one or more aspects of the present disclosure, there is provided a lead frame. The lead frame comprises an outer frame.

The outer frame comprises:
an upper surface;
a lower surface that is opposite to the upper surface;
a side surface between the upper surface and the lower surface;
a first recess that is formed to extend from the upper surface to the side surface;
a second recess that is formed to extend from the lower surface to the side surface; and
a curved surface that is positioned between the side surface and a side wall of the first recess or between the side surface and a side wall of the second recess.

BRIEF DESCRIPTION OF DRAWINGS

FIG. 2 is a plan view of a lead frame according to an embodiment;

FIG. 6A is a sectional view taken along a line I-I of FIG. 3;

FIG. 6B is a sectional view taken along a line II-II of FIG. 3;

FIG. 6C is a sectional view taken along a line III-III of FIG. 3;

FIG. 7A is a sectional view showing a state in which lead frames in FIG. 2 are stored in a frame stocker;

FIG. 7B is a partial perspective view showing a state in which a lead frame in FIG. 2 is stored in a frame stocker;

FIGS. 9A and 9B are plan views (Part 2) showing the manufacturing method of the lead frame according to the embodiment;

FIG. 9C shows a modification of the lead frame shown in FIG. 9A;

FIGS. 11A and 11B are plan views (Part 4) showing the manufacturing method of the lead frame according to the embodiment;

DETAILED DESCRIPTION

An embodiment will be described below with reference to the accompanying drawings.

A preliminary matter underlying the embodiment will be described prior to description of the embodiment.

Figure 1A:
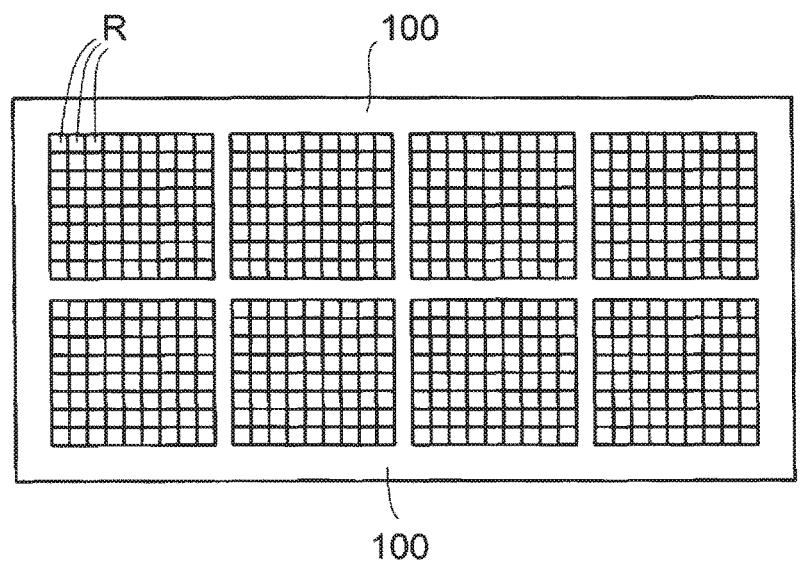
FIGS. 1A and 1B are a plan view and a perspective view for explaining a lead frame according to a preliminary matter.
Figure 1B:
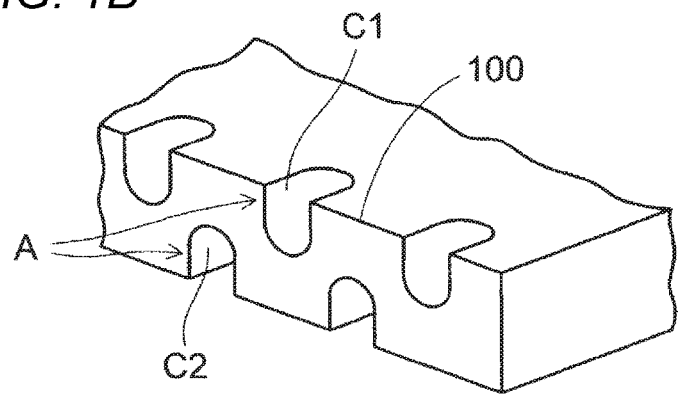

FIGS. 1A and 1B are views for explaining a lead frame according to the preliminary matter. Description of the preliminary matter is about the details of personal study of the present inventor, which contain techniques not belonging to known techniques.

As shown in FIG. 1A, the lead frame according to the preliminary matter is provided with an outer frame 100. The outer frame 100 has an oblong outer shape. A plurality of product regions R are defined inside the outer frame 100. A die pad and leads (not shown) etc. coupled to the outer frame 100 are disposed in each of the product regions R.

The lead frame is stored in a frame stocker (not shown) in a manufacturing process of building semiconductor devices or during transportation. The frame stocker is made of metal.

A plurality of rails are provided side by side in an up/down direction on each of inner walls of opposed side plates of the frame stocker. Opposite edge portions of the outer frame 100 on long sides of the lead frame are disposed on the rails on the opposite sides of the frame stocker. Thus, a plurality of lead frames can be stored in the frame stocker.

When a lead frame is taken into or out of the frame stocker, long side surfaces of an outer frame 100 of the lead frame contact and rub the inner walls of the side plates of the frame stocker.

Therefore, burrs are apt to occur at the side surfaces of the outer frame 100 of the lead frame and the inner walls of the side plates of the frame stocker. When a burr occurring thus separates from the lead frame, the burr is apt to scatter onto a region where a die pad or a lead of the lead frame has been disposed.

When the burr has a length longer than a distance between the die pad and the lead or a distance between the lead and another lead adjacent thereto, the die pad and the lead or the adjacent leads are connected to each other through the burr. As a result, electric short-circuiting occurs.

As a measure to cope with the problem, a method is provided to form first recesses C1 and second recesses C2 in an upper surface and a lower surface of each of outer edge portions of the outer frame 100 of the lead frame in FIG. 1A to extend to the middle of a thickness of the outer edge portion of the outer frame 100, as shown in a partial perspective view of FIG. 1B.

Thus, a length of each of right-angled portions of the side surfaces of the outer frame 100 of the lead frame is shortened. Therefore, even when a burr occurs, the length of the burr is shorter. As a result, it is possible to reduce the risk that a die pad and a lead or leads adjacent to each other may be connected to each other through the burr.

However, each portion (portion A in FIG. 1B) where an inner wall of the first recess C1 or an inner wall of the second recess C2 borders on a side surface of the outer frame 100 is formed at a sharp right angle. Therefore, a burr is apt to occur at the portion. To solve this problem, it is desirable to form a structure in which occurrence of burrs can be suppressed better than in the structure of the side surface of the outer edge portion of the outer frame 100 of the lead frame in FIG. 1B.

The aforementioned problem can be solved by a lead frame according to the embodiment which will be described below.

Embodiment

FIGS. 2 to 7 are views for explaining the lead frame according to the embodiment. FIGS. 8 to 12 are views for explaining a manufacturing method of the lead frame according to the embodiment.

As shown in FIG. 2, the lead frame 1 according to the embodiment has a frame structure which is formed by an outer frame 10 and an inner frame 12. The outer frame 10 has an oblong (rectangular) outer shape. The inner frame 12 is coupled to the outer frame 10. In the oblong shape of the outer frame 10, a pair of frame portions extending horizontally are longer in length than a pair of frame portions extending vertically.

Each of square regions defined by the outer frame 10 and the inner frame 12 serves as one product region R. A square die pad 20 is disposed in a central portion of the product region R. In addition, support bars 22 are connected to four corners of the die pad 20 respectively. The support bars 22 are coupled to the outer frame 10 and the inner frame 12.

In this manner, the die pad 20 is supported in the outer frame 10 and the inner frame 12 by the four support bars 22.

Further, four leads 24 are provided on each side. The leads 24 are coupled to the outer frame 10 and the inner frame 12 which are opposed to the four sides of the die pad 20 of the product region R. In the product region R, the leads 24 extend from inner walls of the outer frame 10 and the inner frame 12 toward the die pad 20 provided inside the product region R.

In the example of the lead frame 1 in FIG. 2, 2×4 product regions R are provided. However, the number or the layout of the product regions R provided in one lead frame 1 can be set desirably.

The lead frame 1 according to the embodiment can be manufactured by wet-etching and patterning a metal plate from its opposite surface sides. The lead frame 1 is formed of the metal plate made of copper, a copper alloy, an iron—nickel alloy, or the like. Preferably, a nickel (Ni) layer/a palladium (Pd) layer/a gold (Au) layer are formed on the whole of the lead frame 1 including upper, lower and side surfaces thereof, in the named order from bottom to top by electroplating.

Alternatively, the nickel (Ni) layer/the palladium (Pd) layer/the gold (Au) layer may be formed only on upper surfaces of the leads 24 to be wire-bonded, in the named order from bottom to top.

In addition, a single silver (Ag) layer may be formed by electroplating in place of the nickel (Ni) layer/the palladium (Pd) layer/the gold (Au) layer.

Figure 3:
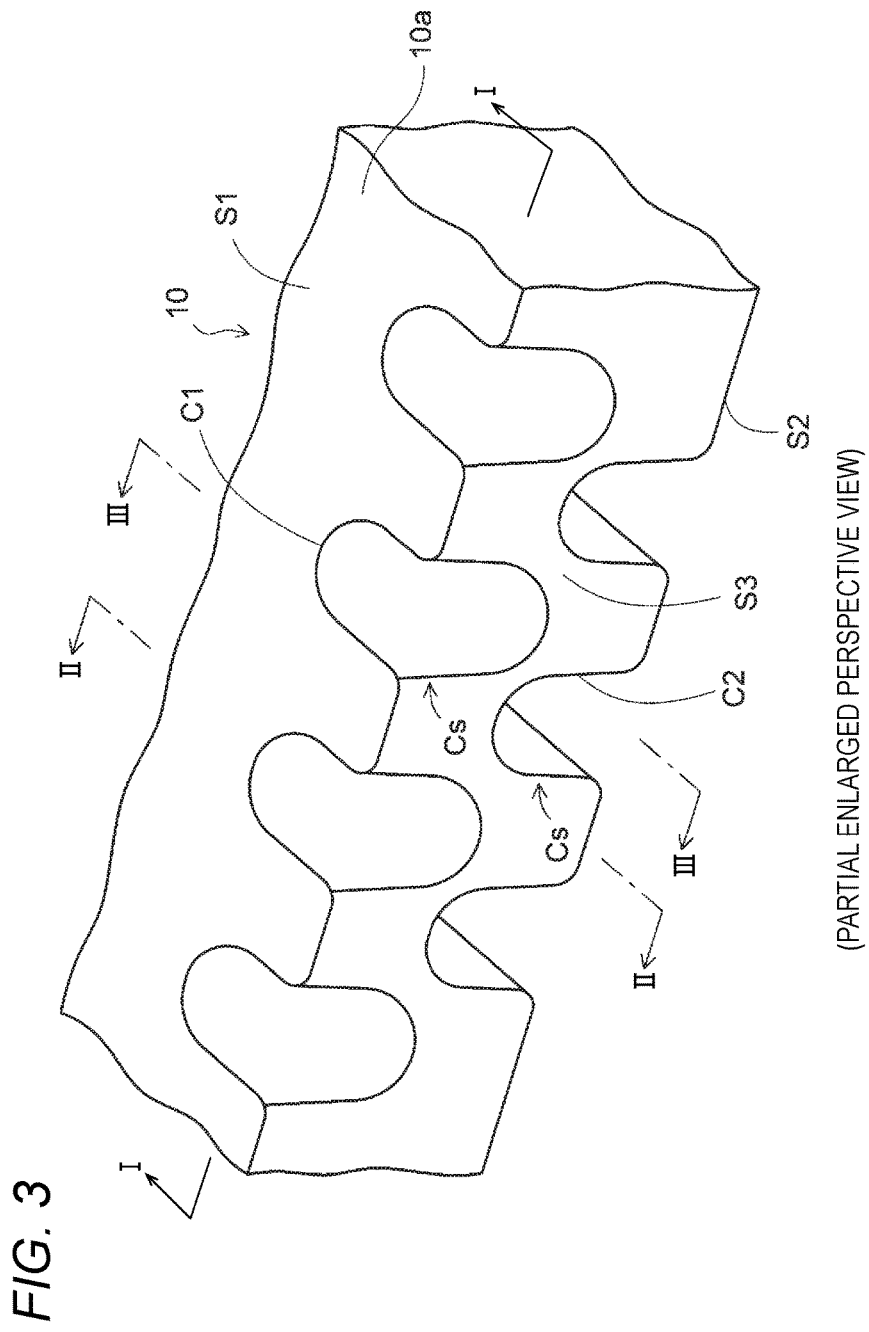
FIG. 3 is a partial enlarged perspective view showing a long side surface of an outer frame of the lead frame in FIG. 2.
Figure 4:
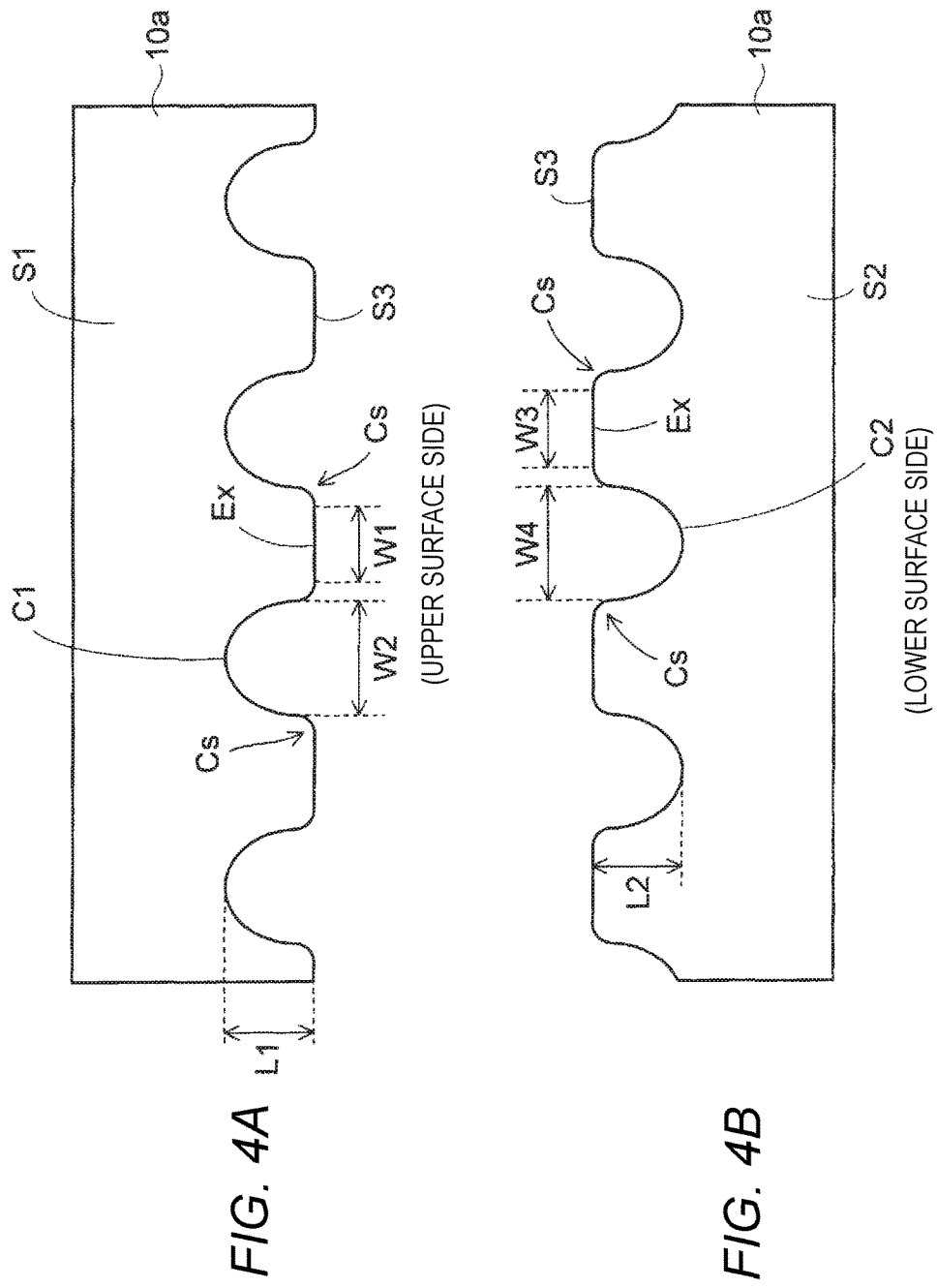
FIGS. 4A and 4B are partial plan views showing the long side surface of the outer frame of the lead frame in FIG. 2.

FIG. 3 is a partial enlarged perspective view showing an enlarged side surface (portion designated by B) of an outer edge portion 10a of the outer frame 10 of the lead frame 1 in FIG. 2.

As shown in FIG. 3, the outer edge portion 10a of the outer frame 10 of the lead frame 1 is provided with an upper surface S1, a lower surface S2, and a side surface S3. A plurality of first recesses C1 are formed to extend from the upper surface S1 of the outer edge portion 10a of the outer frame 10 of the lead frame 1 to the side surface S3 thereof. The first recesses C1 are formed to extend from the upper surface S1 of the outer edge portion 10a of the outer frame 10 to the middle of a thickness of the outer edge portion 10a. Horizontal opening ends of the first recesses C1 are exposed from the side surface S3 of the outer frame 10.

In a similar manner or the same manner, a plurality second recesses C2 are formed to extend from the lower surface S2 of the outer edge portion 10a of the outer frame 10 of the lead frame 1 to the side surface S3 thereof. The second recesses C2 are formed to extend from the lower surface S2 of the outer edge portion 10a of the outer frame 10 to the middle of the thickness of the outer edge portion 10a. Horizontal opening ends of the second recesses C2 are exposed from the side surface S3 of the outer frame 10.

The first recesses C1 and the second recesses C2 are disposed side by side at predetermined intervals along the side surface S3 of the outer end portion 10a of the outer frame 10. Each of the first recesses C1 is disposed between adjacent ones of the second recesses C2 in plan view. In this manner, the first recesses C1 and the second recesses C2 are provided alternately so as to vary in position from each other respectively in plan view.

FIG. 4A is a partial plan view of FIG. 3, as seen from top. FIG. 4B is a partial plan view of FIG. 3, as seen from bottom. As shown in FIGS. 4A and 4B, each of the first recesses C1 and the second recesses C2 is formed as a curved recess in plan view. For example, a semicircular recess is illustrated as the first, second recess C1, C2 in plan view.

Refer to FIG. 4A in addition to FIG. 3. A portion where a side wall of each of the first recesses C1 borders on the side surface S3 of the outer edge portion 10a of the outer frame 10 is rounded and formed into a round surface Cs. Thus, the portion where the side wall of the first recess C1 borders on the side surface S3 of the outer edge portion 10a of the outer frame 10 is formed into a curved shape.

Refer to FIG. 4B in addition to FIG. 3. In a similar manner or the same manner, a portion where a side wall of each of the second recesses C2 borders on the side surface S3 of the outer edge portion 10a of the outer frame 10 is rounded and formed into a round surface Cs. Thus, the portion where the side wall of the second recess C2 borders on the side surface S3 of the outer edge portion 10a of the outer frame 10 is formed into a curved shape.

Thus, side wall portions of the horizontal opening ends of the first recess C1 and the second recess C2 are rounded and formed into the round surfaces Cs respectively.

In FIGS. 4A and 4B, lines of the bottoms of the first recess C1 and the second recess C2 are omitted in order to simplify illustration.

Roundness of each of the round surfaces Cs of the first recess C1 and the second recess C2 is set in a range of from R 0.01 mm to R 0.1 mm. The R 0.01 mm corresponds to an arc shape of a circle having a radium of 0.01 mm. The R 0.1 mm corresponds to an arc shape of a circle having a radium of 0.1 mm.

In addition, of an upper end of the side surface S3 of the outer frame 10, a portion between adjacent ones of the first recesses C1 is formed as a flat portion Ex which is linear in plan view, as shown in FIG. 4A. A width W1 of the flat portion Ex measures, for example, 0.01 mm to 0.1 mm. The portion of the upper end of the side surface S3 of the outer frame 10 is a portion where the side surface S3 and the upper surface S1 border on each other.

In a similar manner or the same manner, of a lower end of the side surface S3 of the outer frame 10, a portion between adjacent ones of the second recesses C2 is formed as a flat portion Ex which is linear in plan view, as shown in FIG. 4B. A width W3 of the flat portion Ex measures, for example, 0.01 mm to 0.1 mm. The portion of the lower end of the side surface S3 of the outer frame 10 is a portion there the side surface S3 and the lower surface S2 border on each other.

A width W2 of the first recess C1 and a width W4 of the second recess C2 are set, for example, in a range of from 0.1 mm to 0.2 mm. In addition, a depth L1 of the first recess C1 and a depth L2 of the second recess C2 are set, for example, in a range of from 0.1 mm to 0.2 mm.

Here, a different case from the embodiment will be described as follows. That is, of the upper end and the lower end of the side surface S3 of the outer frame 10, the portion between adjacent ones of the first recesses C1 and the portion between adjacent ones of the second recesses C2 are formed into semicircular shapes connected to the round surfaces Cs respectively in plan view. In this case, when the metal plate is wet-etched to obtain such a lead frame, the position of a front end of the side surface of the outer frame 10 of the lead frame is set back inward to cause a variation easily. A width of the lead frame according to design specifications cannot be obtained stably.

Further, when the width of the lead frame is measured by image recognition, recognition of an outer edge line of the outer frame 10 may be so unclear that the width cannot be measured accurately.

In the embodiment, of the upper end of the side surface S3 of the outer frame 10, the portion between the adjacent first recesses C1 is formed as the flat portion Ex which is linear in plan view. In addition, of the lower end of the side surface S3 of the outer frame 10, the portion between the adjacent second recesses C2 is formed as the flat portion Ex which is linear in plan view. Therefore, when the metal plate is wet-etched to obtain the lead frame 1, the outer frame 10 of the lead frame 1 has more linear portions in the opposite side surfaces S3 in plan view. Accordingly, it is possible to obtain the lead frame having a stable width.

In addition, an outer edge line of the outer frame 10 of the lead frame 1 can be image-recognized clearly. Accordingly, the width can be measured reliably.

Figure 5:
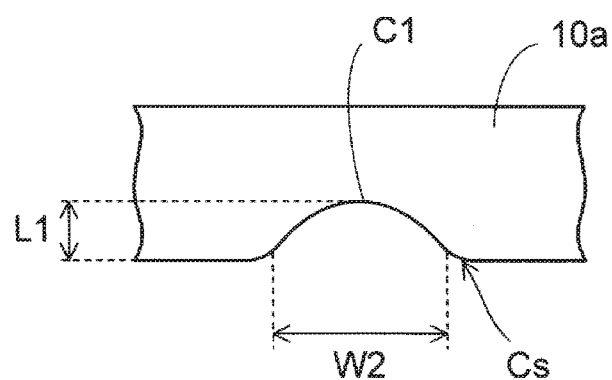
FIG. 5 is a partial plan view showing a modification of a first recess in FIG. 4A.

FIG. 5 is a partial plan view showing a modification of the first recess C1 in FIG. 4A. As shown in FIG. 5, the first recess C1 is formed as a curved recess in plan view, and a width W2 of the first recess C1 is made longer than a depth L1 of the first recess C1. Thus, the round surface Cs is formed into a gently curved shape easily. Therefore, the structure formed thus is more preferable from a viewpoint of suppressing burrs from occurring. The same thing is also applied to the second recess C2 on the lower surface side of the outer frame 10.

FIG. 6A is a sectional view taken along a line I-I of FIG. 3 passing through a middle position of the depth of each of the first and second recesses C1 and C2. As shown in FIG. 6A, the first recesses C1 which are formed in an upper portion of the side surface of the outer frame 10 and the second recesses C2 which are formed in a lower portion of the side surface of the outer frame 10 are disposed alternately in the horizontal direction so that each of the first recesses C1 is disposed in a region between adjacent ones of the second recesses C2.

The first recesses C1 and the second recesses C2 are formed to extend to the middle of the thickness of the outer frame 10. The first recesses C1 and the second recesses C2 are formed independently so as not to communicate with one another.

FIG. 6B is a sectional view taken along a line II-II of FIG. 3. FIG. 6C is a sectional view taken along a line III-III of FIG. 3. As will be described later, a large-sized metal plate for forming multiple lead frames is wet-etched from its opposite surface sides so that a plurality of lead frames can be obtained.

Therefore, inner walls of the first recesses C1 and the side surface of the outer frame 10 under the first recesses C1 are formed as concavely curved surfaces, as shown in FIG. 6B.

In a similar manner or the same manner, inner walls of the second recesses C2 and the side surface of the outer frame 10 above the second recesses C2 are formed as concavely curved surfaces, as shown in FIG. 6C.

Similar or the same first recesses C1 and similar or the same second recesses C2 are also formed in a side surface of the outer frame 10 on an upper side of the lead frame 1 in FIG. 2. Thus, the first recesses C1 and the second recesses C2 are formed in a pair of the outer edge portions 10a on the opposite long sides of the outer frame 10 respectively.

FIGS. 7A and 7B show a frame stocker 30 in which lead frames 1 according to the embodiment are stored. The frame stocker 30 is provided with a box 38 which is built from a bottom plate 32, a top plate 34 and side plates 36. A front surface of the box 38 is opened. A plurality of rails 36a are provided on each of inner walls of the opposed side plates 36 of the box 38.

The box 38 and the rails 36a of the frame stocker 30 are formed out of metal such as stainless steel.

The lead frames 1 in FIG. 2 are stored in the frame stocker 30. Opposite outer edge portions 10a of an outer frame 10 on long sides of each of the lead frames 1 are disposed on the rails 36a on the opposite sides of the frame stocker 30.

As shown in a partial perspective view in FIG. 7B, when a lead frame 1 is taken into or out of the frame stocker 30, side surfaces of outer edge portions 10a of an outer frame 10 of the lead frame 1 contact and rub the inner walls of the side plates 36 of the frame stocker 30.

On this occasion, in the lead frame 1 according to the embodiment, first recesses C1 are formed on each of upper surface sides of the outer edge portions 10a of the outer frame 10 of the lead frame 1, and second recesses C2 are formed on each of lower surface sides of the same, as described above. Further, a portion where each of inner walls of the first recesses C1 and the second recesses C2 borders on each of the side surfaces of the outer frame 10 is rounded and formed into a round surface Cs.

Thus, burrs can be prevented from occurring at side wall portions of horizontal opening ends of the first recesses C1 and the second recesses C2.

In addition, due to the first recesses C1 and the second recesses C2 which are formed on the upper surface side and the lower surface side of each of the outer end portions 10a of the outer frame 10 of the lead frame 1, the number of right-angled portions in each of an upper end and a lower end of the side surface of the outer frame 10 of the lead frame 1 can be reduced.

Thus, an amount of a burr occurring in the lead frame 1 can be reduced. In addition, even when the burr occurs in the lead frame 1, the burr occurs only at, of the upper end or the lower end of the side surface of the outer frame 10, any right-angled portion disposed between adjacent ones of the first recesses C1 or the second recesses C2. When each of a distance between the adjacent first recesses C1 and a distance between the adjacent second recesses C2 is reduced, a length of the burr can be reduced.

Preferably, the width W1 and the width W3 of the flat portions Ex in FIGS. 4A and 4B are set to be shorter than a distance between a die pad 20 and a lead 24 of the lead frame 1 in FIG. 2 or a distance between leads 24 adjacent to each other.

Thus, even when a burr occurs at one of the flat portions Ex of the lead frame 1 and then scatters onto an inner portion of the lead frame 1, the length of the burr is shorter than the distance between the die pad 20 and the lead 24 or the distance between the adjacent leads 24. Thus, electric short-circuiting between the die pad 20 and the lead 24 or electric short-circuiting between the adjacent leads 24 can be prevented from occurring.

In addition, in the lead frame 1 according to the embodiment, each of the first recesses C1 on the upper surface side of the outer end portion 10a of the outer frame 10 of the lead frame 1 is disposed between adjacent ones of the second recesses C2 on the lower surface side of the same in plan view, and the first recesses C1 and the second recesses C2 are disposed alternately so as to vary in position from each other respectively, as shown in FIG. 3.

A case different from the embodiment will be described as follows. That is, the first recesses C1 and the second recesses C2 are disposed at positions corresponding to each other respectively. In this case, any portion of the side surface of the outer frame 10 ranging from the upper end thereof to the lower end thereof is disposed between the first recesses C1 and the second recesses C2.

On the other hand, when the first recesses C1 and the second recesses C2 are disposed so as to vary in position from each other respectively as in the embodiment, the upper portion of the side surface of the outer frame 10 is disposed between adjacent ones of the first recesses C1, and the lower portion of the side surface of the outer frame 10 is disposed between adjacent ones of the second recesses C2.

Thus, the upper portion and the lower portion of the side surface of the outer frame 10 are disposed to vary in position from each other. Accordingly, a contact surface of the outer frame 10 contacting each of the inner walls of the side plates 36 of the frame stocker 30 is substantially divided into a plurality so that the number of contact positions can be increased. Thus, mechanical stress applied to the side surface of the outer frame 10 is distributed to the contact positions so that mechanical stress applied to one contact position can be reduced. Thus, burrs can be suppressed from occurring.

In addition, the number of the right-angled portions in each of the side surfaces of the outer frame 10 of the lead frame 1 is reduced. Accordingly, burrs can be also suppressed from occurring at the inner walls of the side plates 36 of the frame stocker 30.

When the lead frame 1 in FIG. 2 is stored in the frame stocker 30, a pair of short side surfaces of the outer frame 10 of the lead frame 1 do not rub the inner walls of the side plates 36 of the frame stocker. Accordingly, first recesses C1 and second recesses C2 do not have to be formed in the pair of short side surfaces of the outer frame 10 of the lead frame 1.

A conveyance mechanism for various manufacturing devices may contact both the long side surfaces and the short side surfaces of the outer frame 10 in an assembling step of electronic component devices using the lead frame 1, as will be described later. On this occasion, burrs may occur in the short side surfaces of the outer frame 10 of the lead frame 1.

Therefore, the first recesses C1 and the second recesses C2 may be formed in the short side surfaces of the outer frame 10 if necessary. Thus, burrs can be prevented from occurring in the short side surfaces of the lead frame 1.

Next, a manufacturing method of the aforementioned lead frame 1 in FIG. 2 will be described.

Figure 8:
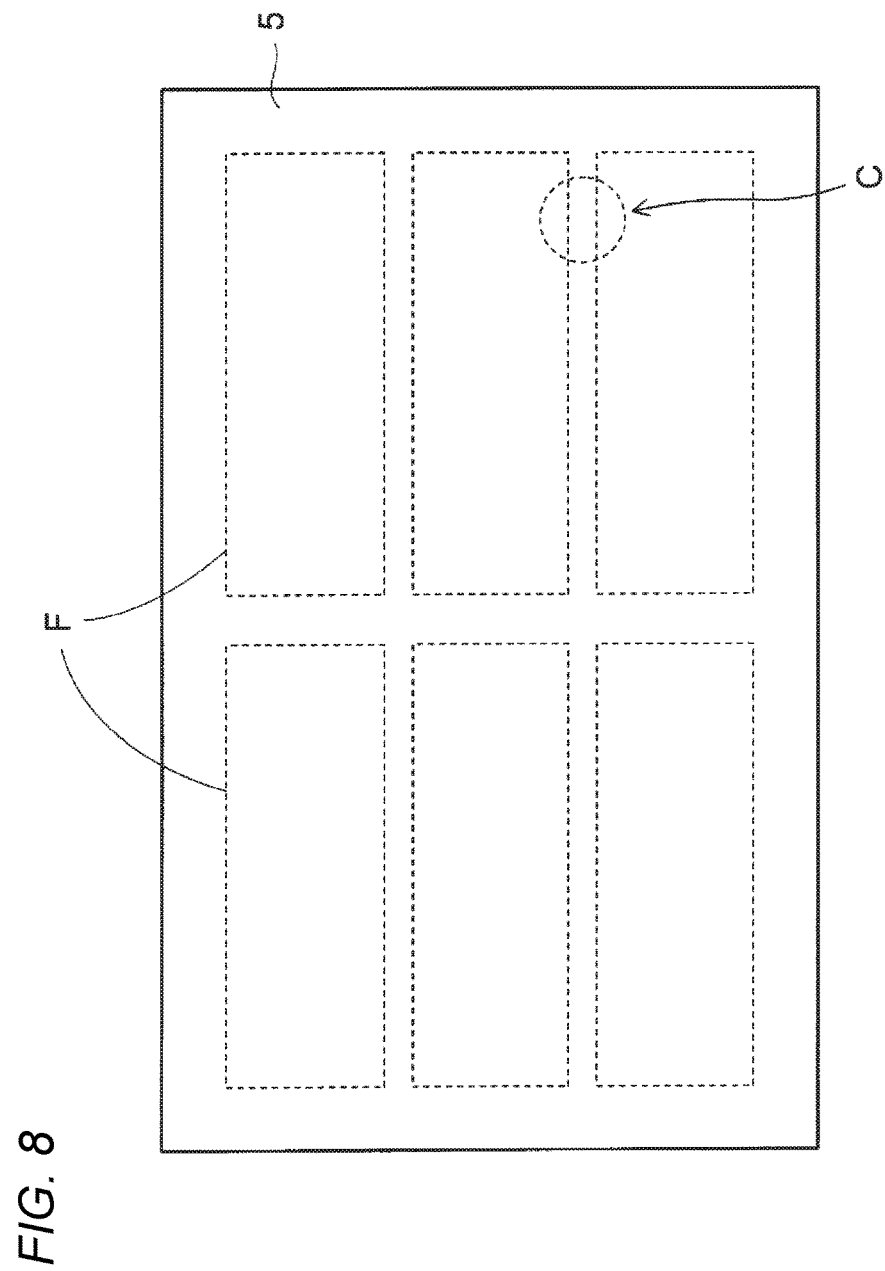
FIG. 8 is a plan view (Part 1) showing a manufacturing method of the lead frame according to the embodiment.

As shower FIG. 8, first, a large-sized metal plate 5 for forming multiple lead frames 1 is prepared. The metal plate 5 is formed out of copper, a copper alloy, an iron—nickel alloy, or the like to be 0.1 mm to 0.25 mm thick.

A plurality of frame regions F are defined in the metal plate 5. The aforementioned lead frame 1 in FIG. 2 can be obtained from each of the frame regions F.

Patterns (not shown) of resist layers for obtaining the aforementioned lead frame (frame member) in FIG. 2 are formed on opposite surface sides of each of the frame regions F of the metal plate 5 based on photolithography.

FIGS. 9A and 9B are partial enlarged plan views showing a state of outer edge portions of outer frame patterns of the resist layers in a boundary region (portion designated by C) between two vertically adjacent frame regions F in FIG. 8.

FIG. 9A is a partial enlarged plan view showing first resist layers 15 on an upper surface side of the metal plate 5. FIG. 9B is a partial enlarged plan view showing second resist layers 17 on a lower surface side of the metal plate 5.

The first resist layers 15 for obtaining patterns of the lead frames 1 in FIG. 2 are patterned respectively in the frame regions F on the upper surface side of the metal plate 5, as shown in FIG. 9A.

Each of the first resist layers 15 includes an outer frame pattern having an oblong outer shape, and a plurality of semicircular notch portions N disposed in side surfaces of opening portions 15a of the outer frame pattern. The plurality of notch portions N are disposed side by side in a long-side direction at predetermined intervals.

Of each of the side surfaces of the opening portions 15a of the first resist layer 15, a portion between adjacent ones of the notch portions N is formed as a flat portion Ey. Although not shown, the whole of the outer frame pattern of the first resist layer 15 is formed into a shape corresponding to an outer frame of the aforementioned lead frame 1 in FIG. 2.

In a similar manner or the same manner, the second resist layers 17 for obtaining the patterns of the lead frames 1 in FIG. 2 are patterned respectively in the frame regions F on the lower surface side of the metal plate 5, as shown in FIG. 9B.

In a similar manner to or the same manner as the first resist layers 15, each of the second resist layers 17 includes an outer frame pattern having an oblong outer shape, and a plurality of semicircular notch portions Nx disposed in side surfaces of opening portions 17a of the outer frame pattern. The plurality of notch portions Nx are disposed side by side in the long-side direction at predetermined intervals. In a similar manner to or the same manner, of each of the side surfaces of the opening portions 17a of the second resist layer 17, a portion between adjacent ones of the notch portions Nx is formed as a flat portion Ez.

The notch portions N and Nx of the first and second resist layers 15 and 17 are disposed in order to form first recesses C1 and second recesses C2 in an outer frame 10 of the aforementioned lead frame 1. Therefore, the notch portions N of the first resist layer 15 on the upper surface side of the metal plate 5 and the notch portions Nx of the second resist layer 17 on the lower surface side of the metal plate 5 are disposed alternately so as to vary in position from each other respectively in plan view.

Here, as shown in FIG. 9A, an angle θ at which each of side walls of the notch portions N borders on each of the side surfaces of the opening portions 15a of the first resist layer 15 is set to be larger than 90° but not larger than 135° in order to form each of side wall portions of opening ends of the first recesses C1 into a sufficiently round surface Cs as shown in the aforementioned FIG. 4A.

The second resist layer 17 formed on the lower surface of the metal plate 5 is also patterned into a shape similar to or the same as that of the first resist layer 15.

Alternatively, the first resist layer 15 may be patterned so that a portion where each of the side walls of the notch portions N borders on each of the side surfaces of the opening portions 15a of the first resist layer 15 can be formed into a round curved surface Cx, as shown in FIG. 9C showing a modification of FIG. 9A. The same thing is also applied to the second resist layer 17 on the lower surface side.

Although not shown particularly, the first and second resist layers 15 and 17 are patterned on the opposite surface sides of the metal plate 5 so that the outer frame 10, an inner frame 12, die pads 20, support bars 22, and leads 24 of the aforementioned lead frame 1 can be obtained in each of the frame regions F of the metal plate 5 in FIG. 8.

Next, the metal plate 5 is wet-etched from its opposite sides through the opening portions 15a and 17a using the first and second resist layers 15 and 17 on the opposite surface sides of the metal plate 5 as masks.

When a copper plate is used as the metal plate 5, a ferric chloride solution, a cupric chloride solution, an ammonium copper chloride solution, or the like can be used as an etchant. A spray etching device can be used preferably as an etching device.

Figure 10A:
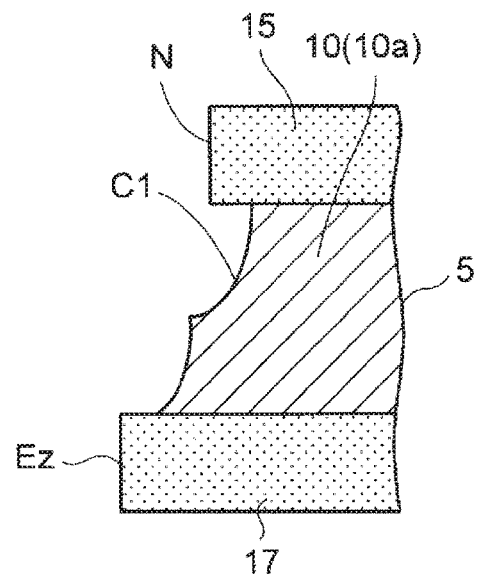
FIGS. 10A and 10B are sectional views (Part 3) showing the manufacturing method of the lead frame according to the embodiment.

On this occasion, the metal plate 5 is perforated so that an etching face from the notch portions N (FIG. 9A) of the first resist layer 15 on the upper surface side of the metal plate 5 and an etching face from the flat portions Ez (FIG. 9B) of the side surfaces of the opening portions 17a of the second resist layer 17 on the lower surface side of the metal plate 5 can communicate with each other, as shown in FIG. 10A. FIG. 10A shows an etching section of the metal plate 5 in a region inside each of the notch portions N of the first resist layer 15 in FIG. 9A.

Figure 10B:
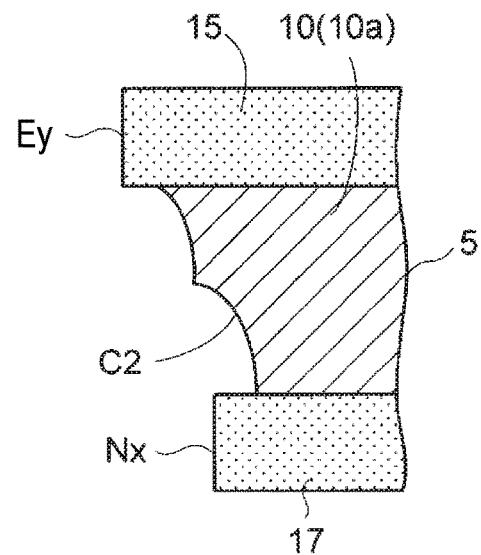

Simultaneously, the metal plate 5 is perforated so that the etching face from the flat portions Ey (FIG. 9A) of the side surfaces of the first resist layer 15 on the upper surface side of the metal plate 5 and the etching face from the notch portions Nx (FIG. 9B) of the second resist layer 17 on the lower surface side of the metal plate 5 can communicate with each other, as shown in FIG. 10B.

FIG. 10B shows an etching section of the metal plate 5 in a region inside each of the flat portions Ey of the first resist layer 15 in FIG. 9A.

Thus, the outer frame 10 which is shaped like a rectangle is formed. At the same time, the first recesses C1 are formed to extend from upper surfaces of outer edge portions 10a of the outer frame 10 to side surfaces of the outer edge portions 10a, and the second recesses C2 are formed to extend from lower surfaces of the outer edge portions 10a to the side surfaces of the outer edge portions 10a.

FIGS. 11A and 11B show a state in which the metal plate 5 has been wet-etched from its opposite sides to be perforated and the first and second resist layers 15 and 17 have been removed.

In this manner, the metal plate 5 is perforated from its opposite surface sides to be patterned so that frame members 1x including the outer frames 10 can be obtained in the frame regions F respectively. FIG. 11A is a partial enlarged plan view showing the upper surface sides of the outer edge portions 10a of the outer frames 10 of the frame members 1x. FIG. 11B is a partial enlarged plan view showing the lower surface sides of the outer edge portions 10a of the outer frames 10 of the frame members 1x.

Each of the notch portions N of the opening portions 15a of the first resist layers 15 on the upper surface side and each of the notch portions Nx of the opening portions 17a of the second resist layers 17 on the lower surface side are disposed in regions not overlapping with each other, so that the notch portion N and the notch portion Nx vary in position from each other in plan view. Due to the provision of the notch portions N and Nx, the first recesses C1 are formed on the upper surface side of the metal plate 5 to extend to the middle of a thickness of the metal plate 5, and the second recesses C2 are formed on the lower surface side of the metal plate 5 to extend to the middle of the thickness of the metal plate 5, as shown in FIG. 3.

Refer to the aforementioned FIG. 9A on this occasion. The angle θ at which each of the side walls of the notch portions N of the first resist layers 15 borders on the side surface of the opening portion 15a of the first resist layer 15 is set to be larger than 90°. The metal plate 5 is etched isotropically from lower ends of the opening ends of the notch portions N of the first resist layers 15 in FIG. 9A.

Thus, as shown in FIG. 11A, the side wall portions of the horizontal opening ends of the first recesses C1 are etched to be chamfered so that each of the side wall portions of the horizontal opening ends of the first recesses C1 is rounded and formed into a round surface Cs.

When the angle θ of each of the opening ends of the notch portions N of the first resist layers 15 in FIG. 9A is set to be not larger than 90°, the side wall portion of the horizontal opening end of the first recess C1 cannot be chamfered easily so that the side wall portion of the horizontal opening end of the first recess C1 is formed into a round surface having small roundness. Accordingly, the angle θ is preferably set to exceed 90° in order to obtain a round surface with sufficient roundness.

Alternatively, when the pattern of the first resist layer 15 according to the aforementioned modification of FIG. 9A is used, the side wall portion of the opening end of the first recess C1 is formed into a round surface Cs with sufficient roundness correspondingly to the curved surface Cx of the opening end of the notch portion N of the first resist layer 15. In this case, the second resist layer 17 on the lower surface side is also patterned in a similar manner to or the same manner as in the modification of FIG. 9A so that the second recesses C2 each having a similar shape or the same shape can be obtained.

The metal plate 5 is wet-etched isotropically from its opposite surface sides to be perforated so that the curved etching face from the upper surface side and the curved etching face from the lower surface side can communicate with each other. As a result, the inner surfaces of the first recesses C1 and the side surfaces of the outer frame 10 under the first recesses C1 are formed as concavely curved surfaces respectively, as shown in the aforementioned FIG. 6B and FIG. 10A.

The second resist layer 17 formed on the lower surface side of the metal plate 5 is formed with a similar pattern to or the same pattern as the first resist layer 15. Due to the provision of the second resist layer 17, each of the side wall portions of the opening ends of the second recesses C2 formed on the lower surface side of the outer frame 10 of the frame member 1x is formed into a round surface Cs with sufficient roundness in a similar manner to or the same manner as that of the first recess C1, as shown in FIG. 11B.

In a similar manner or the same manner, the inner surfaces of the second recesses C2 and the side surfaces of the outer frame 10 under the second recesses C2 are formed as concavely curved surfaces respectively, as shown in the aforementioned FIG. 6C and FIG. 10B.

As shown in FIG. 11A, of each of the upper ends of the side surfaces of the outer frames 10, a portion between adjacent ones of the first recesses C1 is formed as a flat portion Ex which is linear in plan view correspondingly to the flat portion Ey of the side surface of the first resist layer 15. Further, in a similar manner or the same manner, of each of the lower ends of the side surfaces of the outer frames 10, a portion between adjacent ones of the second recesses C2 is formed as a flat portion Ex which is linear in plan view correspondingly to the flat portion Ez of the side surface of the second resist layer 17, as shown in FIG. 11B. Thus, it is possible to form the lead frame having a desired width stably, as described above.

In addition, the metal plate 5 is etched isotropically from the notch portions N and Nx of the first and second resist layers 15 and 17 to reach the middle of the thickness so that the first recesses C1 and the second recesses C2 are formed in the side surfaces of the outer frame 10.

Therefore, the depth of each of the first recesses C1 and the second recesses C2 is formed to be deeper on the opening end side (side surface side of the outer frame 10) than on the deep side (inner portion side of the outer frame 10) of the first, second recess C1, C2 (see FIGS. 10A and 10B).

Although not shown particularly, the metal plate 5 is wet-etched from its opposite surface sides to be perforated inside the respective frame regions F of the metal plate 5 in FIG. 8, with the patterns of the first and second resist layers 15 and 17 on the opposite surface sides as the masks.

Thus, the inner frame 12, the die pads 20, the support bars 22 and the leads 24 are formed to be coupled to the outer frame 10 inside each of the frame regions F of the metal plate 5.

Figure 12:
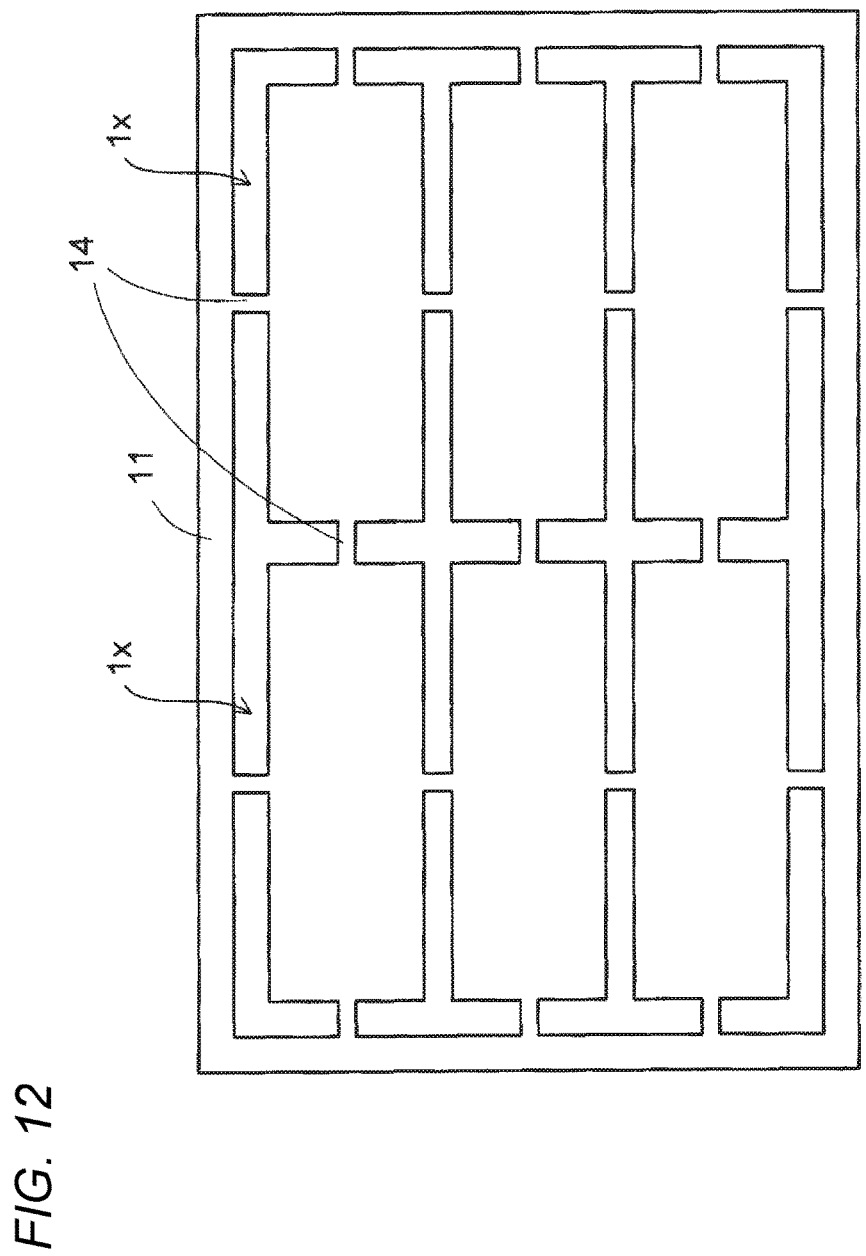
FIG. 12 is a plan view (Part 5) showing the manufacturing method of the lead frame according to the embodiment.

In this manner, the frame members 1x each having the same structure as the lead frame 1 in FIG. 2 are formed respectively in the frame regions F of the metal plate 5 in FIG. 8, as shown in FIG. 12. At this point of time, the frame members 1x disposed in the frame regions F respectively are coupled to an outer peripheral frame 11 in a state in which the frame members 1x are connected to one another through coupling portions 14.

In each of the frame members 1x in FIG. 12, the respective patterns of the outer frame 10, the inner frame 12, the die pads 20, the support bars 22 and the leads 24 are omitted.

Then, the coupling portions 14 of the metal plate 5 in FIG. 12 are cut to separate the frame members 1x disposed in the frame regions F from one another. As a result, lead frames 1 are obtained individually.

In the aforementioned manner, the aforementioned lead frames 1 according to the embodiment as shown in FIG. 2 are manufactured.

Figure 13:
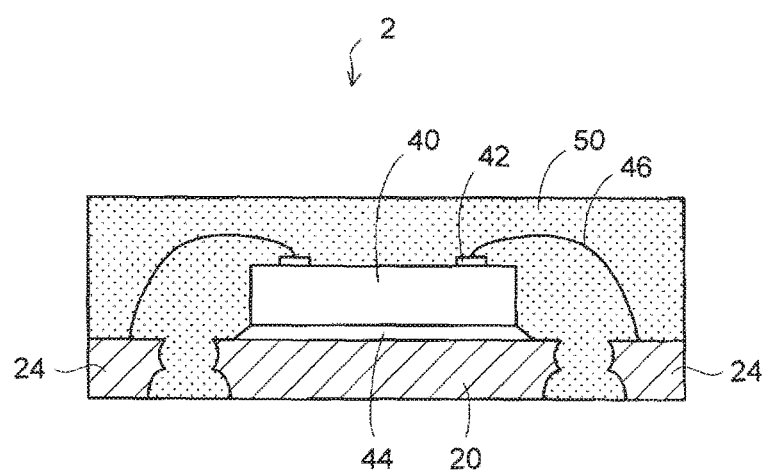
FIG. 13 is a sectional view showing an electronic component device according to the embodiment.

Next, a method of using the aforementioned lead frame in FIG. 2 to build electronic component devices will be described. As shown in FIG. 13, a semiconductor chip 40 provided with connection terminals 42 on its front surface is prepared. A back surface of the semiconductor chip 40 is bonded on each of the die pads 20 of the product regions R of the lead frame 1 in FIG. 2 by an adhesive agent 44.

Next, the connection terminals 42 of the semiconductor chip 40 and the leads 24 are connected to each other respectively through metal wires 46 by a wire bonding method. The metal wires 46 are made of gold, copper, or the like.

Further, a sealing resin (encapsulation resin) 50 for sealing (encapsulating) the die pads 20, the semiconductor chips 40, the metal wires 46, the leads 24, etc. in the product regions R is formed all over the lead frame 1. The sealing resin 50 is formed to cover the upper surface side of the lead frame 1 but to expose the lower surface side of the lead frame 1.

Then, the sealing resin 50 and the lead frame 1 are cut, and the outer frame 10 and the inner frame 12 are separated from the support bars 22 and the leads 24 so that the respective product regions R can be obtained individually.

Thus, the electronic component devices 2 according to the embodiment are obtained. As each of the semiconductor chips 40, for example, a memory, a power supply controller, or an LSI chip such as a CPU can be used. However, various electronic components may be mounted alternatively.

Figure 14:
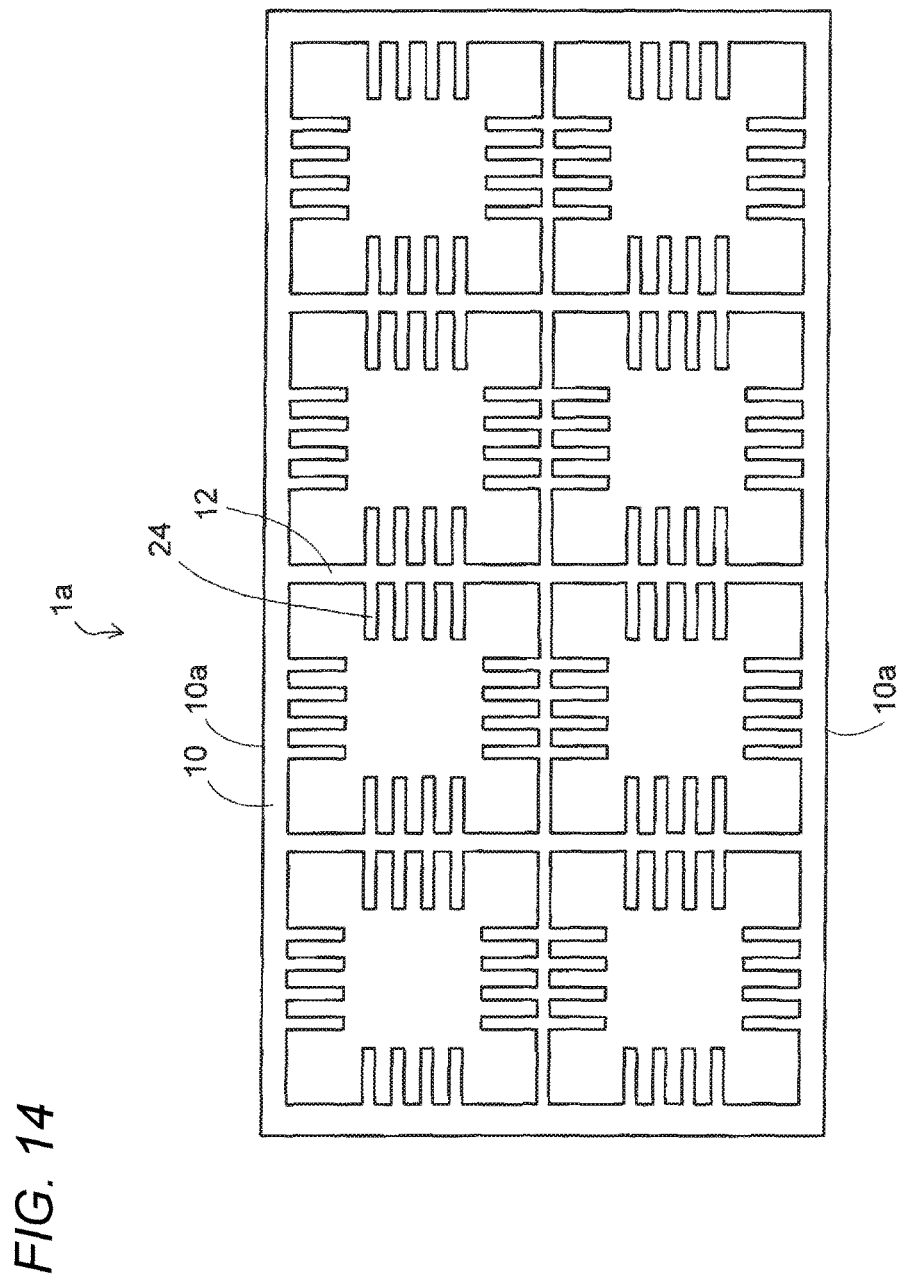
FIG. 14 is a plan view showing a lead frame according to a modification of the embodiment.

FIG. 14 shows a lead frame 1a according to a modification of the embodiment. Die pads 20 and support bars 22 may be removed from the lead frame 1 of FIG. 2, as in the lead frame 1a according to the modification. The remaining structure of the lead frame 1a is the same as that of the aforementioned lead frame 1 in FIG. 2.

Figure 15:
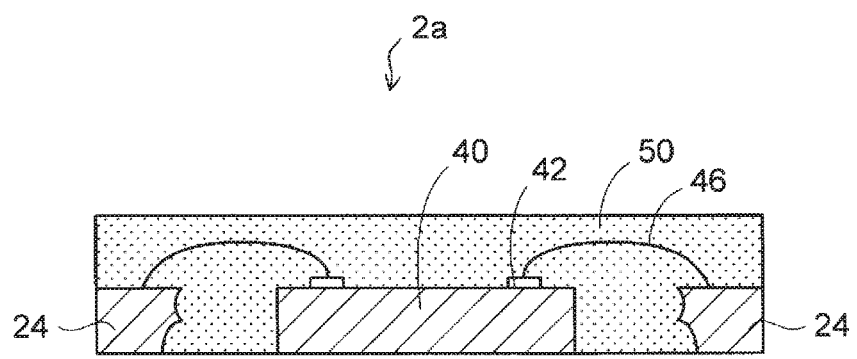
FIG. 15 is a sectional view showing an electronic component device according to the modification of the embodiment.

FIG. 15 shows an electronic component device 2a according to the modification, which uses the lead frame 1a according to the modification as shown in FIG. 14. In the electronic component device 2a according to the modification, as shown in FIG. 15, the die pad 20 is removed from the electronic component device 2 in FIG. 13, and a back surface of a semiconductor chip 40 is exposed from a lower surface of a sealing resin 50. An insulating sheet may be provided on the back surface of the semiconductor chip 40.

Figure 16A:
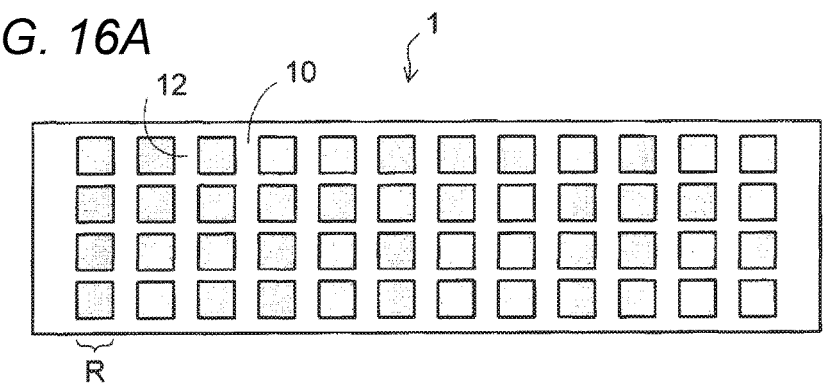
FIGS. 16A to 16C are plan views showing a variety of layouts of a plurality of product regions inside the lead frame according to the embodiment.
Figure 16B:
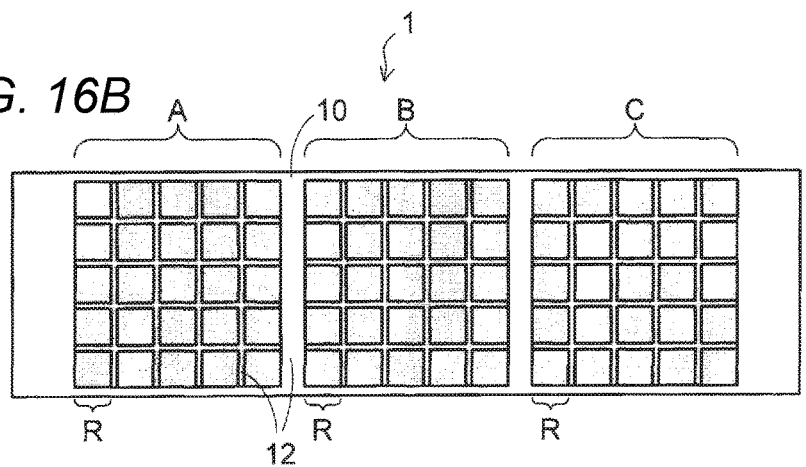
Figure 16C:
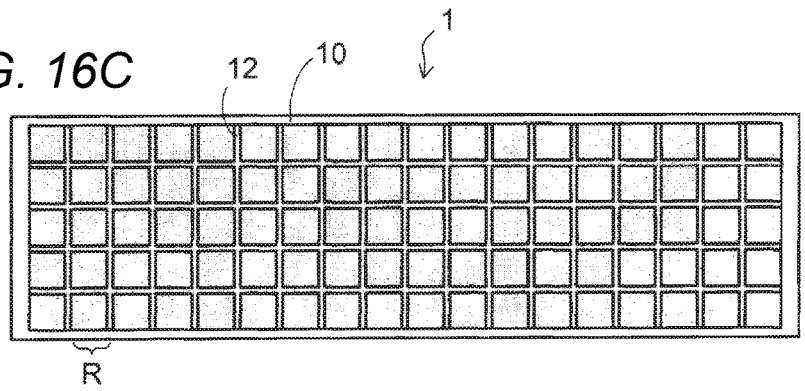

FIGS. 16A to 16C are plan views showing a variety of layouts of product regions R inside the lead frame 1.

In an example of FIG. 16A, the product regions R are disposed dispersively inside the lead frame 1. An inner frame 12 located among the product regions R is set to be wide. When electronic component devices 2 in FIG. 13 are built from the lead frame 1 in FIG. 16A, the respective product regions R are sealed with a sealing resin 50 individually. Further, the inner frame 12 exposed from the sealing resin 50 is cut and punched. As a result, the electronic component devices are obtained individually.

In FIG. 16B, a plurality of blocks in each of which a plurality of product regions R are built adjacently to one another are disposed. In an example of FIG. 16B, three blocks A, B and C are disposed inside the lead frame 1. An inner frame 12 is set to be narrow inside each of the blocks A, B and C, but set to be wide between adjacent ones of the blocks A, B and C.

When electronic component devices 2 in FIG. 13 are built from the lead frame 1 in FIG. 16B, each of the blocks A, B and C is collectively sealed with a sealing resin 50. Further, in the block A, B, C, the sealing resin 50 and the lead frame 1 are cut along boundaries among the product regions R. As a result, the electronic component devices are obtained individually.

In addition, in FIG. 16C, all product regions R are disposed adjacently to one another inside the lead frame 1. When electronic component devices 2 in FIG. 13 are built from the lead frame 1 in FIG. 16C, all the product regions R are sealed collectively with a sealing resin 50. Further, the sealing resin 50 and the lead frame 1 are cut along boundaries among the product regions R. As a result, the electronic component devices are obtained individually.

The electronic component device 2 having the aforementioned structure of FIG. 13 is obtained from each of the product regions R inside the lead frame 1 in FIG. 16B or inside the lead frame 1 in FIG. 16C.

In the aforementioned embodiment, the lead frame 1, 1a and the electronic component devices 2, 2a can be applied to a QFN (Quad Flat Non-Leaded Package) structure.

In addition thereto, the invention may be applied to outer frames of various lead frames used for a QFP (Quad Flat Package), an SOP (Small Outline Package) etc.

As described above, the exemplary embodiment and the modification are described in detail. However, the present invention is not limited to the above-described embodiment and the modification, and various modifications and replacements are applied to the above-described embodiment and the modifications without departing from the scope of claims.

Various aspects of the subject matter described herein are set out non-exhaustively in the following numbered clauses:

1) A method of manufacturing a lead frame, the method comprising:
a) preparing a metal plate in which at least one frame region is defined;
b) forming patterns of resist layers respectively on opposite surfaces of the metal plate in the frame region;
c) wet-etching the metal plate from the opposite surface sides using the resist layers as masks to thereby form a frame member in the frame region;
d) removing the resist layers; and
e) separating the frame member from the frame region to thereby obtain the lead frame,
wherein the frame member comprises an outer frame, and the outer frame comprises:
an upper surface;
a lower surface that is opposite to the upper surface;
a side surface between the upper surface and the lower surface;
a first recess that is formed to extend from the upper surface to the side surface;
a second recess that is formed to extend from the lower surface to the side surface; and
a curved surface that is positioned between the side surface and a side wall of the first recess or between a side wall of the second recess and the side surface.

2) The method according to clause (1), wherein the curved surface comprises:
a first curved surface that is positioned between the side wall of the first recess and the side surface; and
a second curved surface that is positioned between the side wall of the second recess and the side surface.

3) The method according to clause (2), wherein, in the step b),
one of the resist layers that is formed on the upper surface of the metal plate includes a first outer frame pattern, and a first notch portion formed in a side surface of the first outer frame pattern,
the other resist layer that is formed on the lower surface of the metal plate includes a second outer frame pattern, and a second notch portion formed in a side surface of the second outer frame pattern,
the first recess is formed to correspond to the first notch portion,
the second recess is formed to correspond to the second notch portion, and
first and second angles are larger than 90° but not larger than 135° in plan view, wherein the first angle is formed by a side wall of the first notch portion and the side surface of the first outer frame pattern, and the second angle is formed by a side wall of the second notch portion and the side surface of the second outer frame pattern.

4) The method according to clause (1), wherein, in the step c),
the first recess comprises a plurality of first recesses,
the second recess comprises a plurality of second recesses,
the plurality of first recesses and the plurality of second recesses are disposed side by side at predetermined intervals; and
each of the plurality of first recesses is disposed between adjacent ones of the plurality of second recesses in plan view.

5) The method according to clause (4), wherein, in the step c),
a portion of an upper end of the side surface, which is positioned between adjacent ones of the plurality of first recesses, is formed into a linear shape, and
a portion of a lower end of the side surface, which is positioned between adjacent ones of the plurality of second recesses, is formed into a linear shape.

6) The method according to clause (1), wherein, in the step c),
the first recess and the second recess are formed in the side surface that is parallel with a long-side direction of the outer frame.

What is claimed is:
1. A lead frame comprising an outer frame, wherein the outer frame comprises:
an upper surface;
a lower surface that is opposite to the upper surface;
a side surface between the upper surface and the lower surface;
a first recess that is formed to extend from the upper surface to the side surface;
a second recess that is formed to extend from the lower surface to the side surface; and
a curved surface that is positioned between the side surface and a side wall of the first recess or between the side surface and a side wall of the second recess.

2. The lead frame according to claim 1, wherein the curved surface comprises:
- a first curved surface that is positioned between the side wall of the first recess and the side surface; and
- a second curved surface that is positioned between the side wall of the second recess and the side surface.

3. The lead frame according to claim 1, wherein
the first recess comprises a plurality of first recesses,
the second recess comprises a plurality of second recesses,
the plurality of first recesses and the plurality of second recesses are disposed side by side at predetermined intervals; and
each of the plurality of first recesses is disposed between adjacent ones of the plurality of second recesses in plan view.

4. The lead frame according to claim 3, wherein
a portion of an upper end of the side surface, which is positioned between adjacent ones of the plurality of first recesses, is formed into a linear shape, and
a portion of a lower end of the side surface, which is positioned between adjacent ones of the plurality of second recesses, is formed into a linear shape.

5. The lead frame according to claim 1, wherein
the first recess and the second recess are formed in the side surface that is parallel with a long-side direction of the outer frame.

6. The lead frame according to claim 1, wherein
an inner surface of the first recess and an inner surface of the second recess are formed as concavely curved surfaces respectively.

\* \* \* \* \*